(12) United States Patent
Aniket et al.

(10) Patent No.: US 11,199,083 B2
(45) Date of Patent: Dec. 14, 2021

(54) METHOD AND APPARATUS TO PREDICT CASING WEAR FOR WELL SYSTEMS

(71) Applicant: Landmark Graphics Corporation, Houston, TX (US)

(72) Inventors: Aniket Aniket, San Jose, CA (US); Adolfo Gonzales, Houston, TX (US)

(73) Assignee: Landmark Graphics Corporation, Houston, TX (US)

( * ) Notice: Subject to any disclaimer, the term of this patent is extended or adjusted under 35 U.S.C. 154(b) by 33 days.

(21) Appl. No.: 16/607,528

(22) PCT Filed: Jun. 16, 2017

(86) PCT No.: PCT/US2017/037886
§ 371 (c)(1),
(2) Date: Oct. 23, 2019

(87) PCT Pub. No.: WO2018/231248
PCT Pub. Date: Dec. 20, 2018

(65) Prior Publication Data
US 2020/0141225 A1    May 7, 2020

(51) Int. Cl.
*E21B 47/00* (2012.01)
*E21B 41/00* (2006.01)
*G06F 30/20* (2020.01)

(52) U.S. Cl.
CPC .......... *E21B 47/00* (2013.01); *E21B 41/0092* (2013.01); *G06F 30/20* (2020.01)

(58) Field of Classification Search
CPC ...... E21B 47/00; E21B 41/0092; E21B 17/00; E21B 47/007; E21B 7/04; E21B 47/09; E21B 3/00; G06F 30/20; G01V 3/30
See application file for complete search history.

(56) References Cited

U.S. PATENT DOCUMENTS

| | | | |
|---|---|---|---|
| 7,004,021 B2* | 2/2006 | Bilby | E21B 47/09 73/152.43 |
| 7,059,428 B2* | 6/2006 | Frey | G01V 3/30 175/50 |
| 7,546,884 B2* | 6/2009 | Veeningen | E21B 7/04 175/40 |
| 2006/0202685 A1 | 9/2006 | Barolak et al. | |

(Continued)

FOREIGN PATENT DOCUMENTS

WO    2018231248 A1    12/2018

*Primary Examiner* — Regis J Betsch
*Assistant Examiner* — Kaleria Knox
(74) *Attorney, Agent, or Firm* — Tenley Krueger; Parker Justiss, P.C.

(57) ABSTRACT

A method for determining casing wear of casing in a wellbore, a computer program product for determining a back-calculated casing wear factor (CWF) value for casing in a wellbore, and a well site controller are provided herein. In one embodiment, the well site controller includes: (1) an interface configured to receive actual remaining wall thickness (RWT) values that correspond to a set of casing depth values of a wellbore and (2) a processor configured to determine a back-calculated casing wear factor (CWF) value for the wellbore based on a comparison between the actual RWT value and an estimated RWT value, for the set of casing depth values, where the estimated RWT value is calculated using an estimated CWF value as input.

25 Claims, 8 Drawing Sheets

(56) References Cited

U.S. PATENT DOCUMENTS

| | | | |
|---|---|---|---|
| 2006/0272809 A1* | 12/2006 | Tubel | E21B 37/06 166/250.01 |
| 2008/0035334 A1* | 2/2008 | Newman | E21B 17/00 166/250.01 |
| 2014/0041865 A1* | 2/2014 | Paulk | E21B 44/00 166/250.01 |
| 2015/0198030 A1 | 7/2015 | Tello et al. | |
| 2016/0003008 A1* | 1/2016 | Uribe | E21B 7/04 175/50 |
| 2016/0119591 A1 | 4/2016 | Samuel | |
| 2016/0326844 A1* | 11/2016 | Samuel | E21B 3/00 |
| 2017/0022798 A1 | 1/2017 | Samuel et al. | |
| 2017/0292362 A1* | 10/2017 | Aniket | G06N 20/00 |

* cited by examiner

METHOD AND APPARATUS TO PREDICT CASING WEAR FOR WELL SYSTEMS

CROSS-REFERENCE TO RELATED APPLICATION

This application is the National Stage of, and therefore claims the benefit of, International Application No. PCT/US2017/037886 filed on Jun. 16, 2017, entitled "METHOD AND APPARATUS TO PREDICT CASING WEAR FOR WELL SYSTEMS," which was published in English under International Publication Number WO 2018/231248 on Dec. 20, 2018. The above application is commonly assigned with this National Stage application and is incorporated herein by reference in its entirety.

TECHNICAL FIELD

The disclosure relates in general to systems, methods and techniques for drilling and supporting wellbores and more specifically to methods for calculating and estimating casing wear for optimizing well system drilling operations.

BACKGROUND

In the search for hydrocarbons, such as oil and gas, and the development of hydrocarbon-bearing wells, oilfield operators drill boreholes and perform well completion operations. One example of a well completion operation is the installation of casing along a borehole. The drilling crew attaches casing segments together to form the casing as it is being lowered into the borehole to a desired position. Once the crew achieves the desired length and position for a particular casing section, they cement it in place to create a permanent casing section installation. The crew may then extend the borehole by drilling through the terminus of the installed casing section. The process of installing casing sections and extending a borehole can be repeated until a target depth of the borehole is achieved.

While drilling oil and gas wells, the well operators, such as drilling operators, engineers, planners, etc., aim to get to the target depth without wearing out the casing wall significantly so as to cause any casing failures. During drilling and well completion operations, many factors contribute to loss of casing wall integrity or casing wear, such as corrosion, erosion while fracturing, the rotation of the drill string which causes frictional wearing along the contact surfaces with the casing, other mechanical wear, the type of fluid in the wellbore, the amount of pressure the fluid is under, the type of material being drilled through, the angle or geometry of the wellbore, and other factors. Over time, such wearing reduces casing side-wall thickness, degrading the casing strength and integrity. Regardless of the cause, failure of a casing segment can result in expensive well repair operations or abandoning of the well.

BRIEF DESCRIPTION

Reference is now made to the following descriptions taken in conjunction with the accompanying drawing, in which.

DETAILED DESCRIPTION

Figure 1:
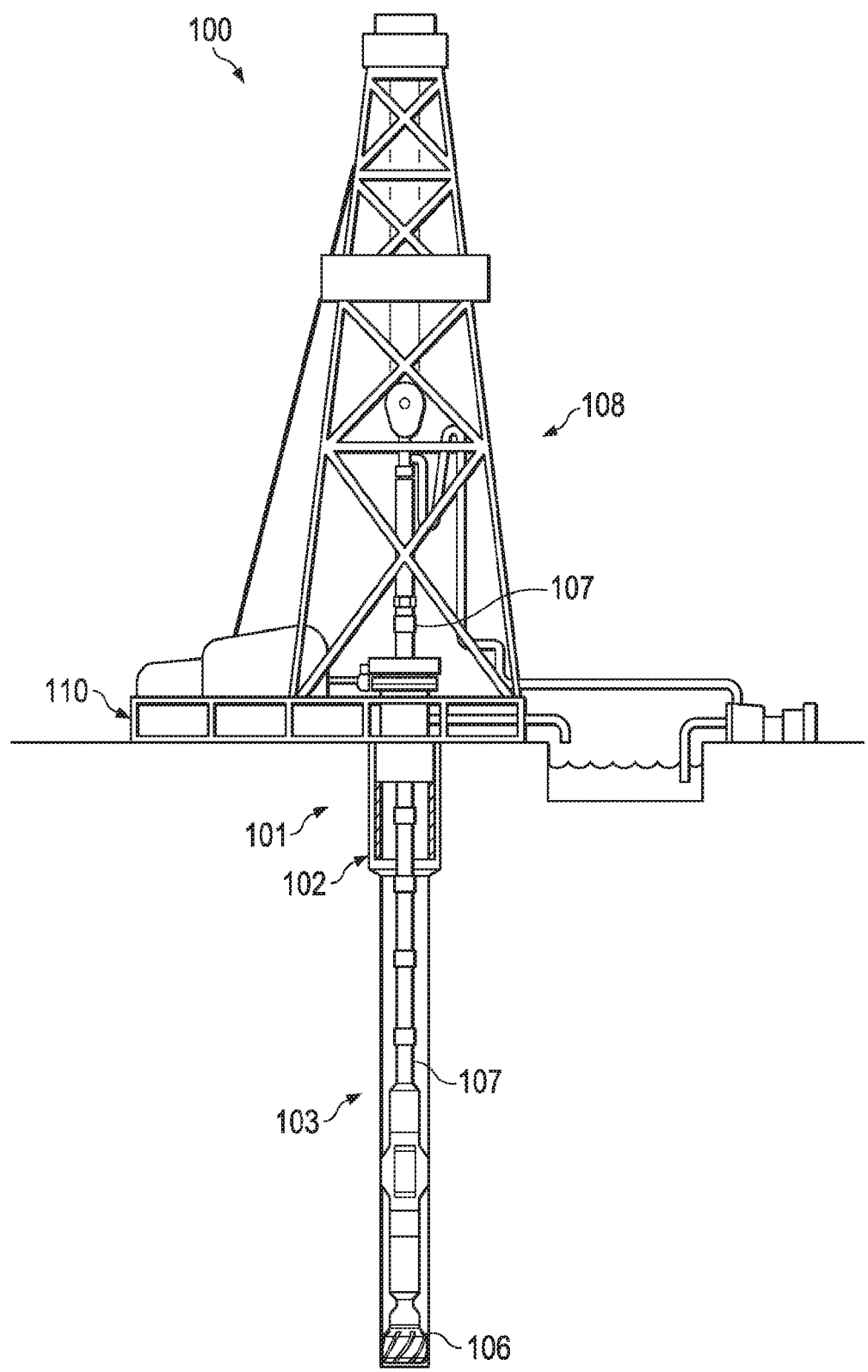
FIG. 1 illustrates a diagram of an example well system with a drill tool inserted into a wellbore.

To reduce the possibility of casing failures due to wear, operators can increase the thickness of the casing material or use a more expensive, wear-resistant material. Regardless of the material, casing wear needs to be tracked and monitored throughout the well operation so well operators have information on casing integrity with a goal to prevent casing failures. Thus, having a real-time understanding of how wearing on the casing walls has progressed since the beginning of a drilling operation and how much time before continued operations cause major damage to the casing walls would be beneficial to a well operator. A thorough understanding of the remaining time as well as remaining revolutions available before reaching a casing wear limit will assist the drilling operator to more accurately plan and adjust operations in real-time so as to remain within the pre-defined constraints and prevent any safety incidents.

Well operators typically maintain well logs for each wellbore to track the casing wear. These well logs, in part, contain the measured thickness of the casing walls at various locations and depths. If excess wear is detected, then drilling and extraction operations can be halted and a repair operation is undertaken, resulting in significant cost to the well operator. These casing wall measurements can be taken through various methods utilizing, for example, caliper logs, or ultrasonic logs. In order to take these measurements, other well operations are suspended and again can result in significant cost or loss of revenue for the well operator. For example, stoppages for a complete measurement of the actual casing remaining wall thickness, in some circumstances, can to lead to a $1-2 million cost to the overall operation. Reducing the number of times a physical measurement needs to be taken is advantageous for the well site operators.

To avoid the high cost of taking remaining wall thickness measurements, well planners often use casing well modeling and simulations to estimate the remaining wall thickness (RWT) of a casing as a means to maintain well integrity at a lower cost. One metric or factor used in the models and simulations is a casing wear factor (CWF). The casing wear factor is a known factor used in the industry for estimating casing wear and is derived from a combination of parameters, such as, material properties, operation type, downhole pressure, downhole temperature, well surveys, wellbore tortuosity and torsion. Other operating parameters, such as rotational speed, rotating time, and normal contact force, can also influence casing wear factors.

Laboratory derived casing wear factors can be used for the well modeling and simulations. However, laboratory testing has limitations since many harsh conditions cannot be properly estimated or recreated in a lab environment. To compensate for this limitation, casing wear factors can be overestimated and therefore result in unnecessary expense for operating a well.

After a casing wear factor is determined, it can then be utilized in casing wear analysis for further well system operational planning. Certain well system operations, such as, but not limited to, drilling, back-reaming, rotating off-bottom, sliding, and reciprocation, when executing, affect the casing remaining wall thickness through wear. The determined casing wear factor can be applied to each of these operations to further determine the amount of casing wear that would occur during an elapsed time period in which such well system operation is executing. A well system engineer, operator, or planner can utilize the determined casing wear for each operational step of the well system plan, to create an updated well system plan where the casing remaining wall thickness value remains within the acceptable tolerance level. Other wellbore conditions can also affect the casing remaining wall thickness values, such as, but not limited to, erosion while fracturing, corrosion, or other types of mechanical wear, and can be combined with the above well system operations to be part of a determined well system plan. As new actual casing remaining wall thickness measurements are taken of the wellbore casing, the well system plan can be iteratively reviewed with new estimations, back-calculated casing wear factors, and trend line analysis to determine an updated well system plan.

This disclosure presents a new method to derive a value for the casing wear factor based on a wear log from the field and utilizing that derived casing wear factor to model a well system plan. The method uses a back-calculated process to derive the casing wear factor from actual casing wear data. The derived casing wear factor can be employed to determine the estimated remaining wall thickness for the casing when selected well operations are conducted over an elapsed time incorporating a drill tool revolution count as well for the selected well operations. Such determination can be further utilized in a well system plan, which in turn could be employed for planning and operating the current or other similar wells. Thus, the disclosure can improve the prediction accuracy of casing conditions, such as casing failure, due to the downhole mechanical wear experienced by the casing during any well drilling operation. In addition to casing failures, casing conditions can include percentage of casing wear, remaining wall thickness of the casing, or another predetermined condition of the casing that has denoted for monitoring. As an example, one method to improve casing failure prediction accuracy disclosed herein includes back-calculating casing wear factors based on multiple log depths from field wear logs that help to more accurately perform casing wear analysis for subsequent operations performed in the well, wherein the casing wear analysis includes estimating the amount of time and revolutions remaining before occurrence of a casing condition is encountered while drilling oil and gas wells.

In one example of a method disclosed herein for back-calculating casing wear factors, a set of casing depth locations are selected and the values of the corresponding minimum remaining wall thickness from the logs are identified. These values of remaining wall thickness are identified as actual remaining wall thickness values. Next, the values of the remaining wall thickness, for each depth point selected, are estimated using a casing wear simulation modeling approach with an initial estimated value for the casing wear factor. The initial values used for the estimated casing wear factor can be obtained from a source, for example, similar well sites, past experiences, how much material has been removed from the wellbore, and controlled or laboratory tests and experiments.

A processor can be programmed to perform a casing wear estimation and analysis algorithm represented by the methods disclosed herein. Using a processor, the estimated remaining wall thickness values are compared to the actual remaining wall thickness values at the corresponding depths to identify how closely each set of actual and estimated remaining wall thickness values align together. An error value is derived and used to determine the accuracy or comfort level of using the estimated casing wear factor for future modeling and simulations.

The error value between the actual casing remaining wall thickness and the estimated casing remaining wall thickness can be computed using a variety of techniques. For example, the error value can be calculated by the sum of error method or the R-square method. These are standard techniques used in statistical analysis to understand correlations between two sets of data points. The most appropriate casing wear factor to be used to estimate casing wear will be a minimum value when utilizing the value of sum of error or R-square methodologies.

The estimated casing wear factor can be continually refined until the error value reaches an acceptable tolerance range or limit. The refined casing wear factor is considered the back-calculated wear factor. The acceptable tolerance range or limit for the error value can vary depending on the specific well site operation. For example, in some circumstances, an error value less than 0.01 indicates that the estimated casing wear factor is appropriate and accurate for estimating future casing wear at the selected point of the wellbore. In other well site operations, an error value less than 0.005 may be a more appropriate target range.

To refine the error value, the initial casing wear factor, for the estimated casing remaining wall thickness calculation, is adjusted and a second casing wear factor is used to calculate a new estimated casing remaining wall thickness. Another comparison is made between the estimated and actual casing remaining wall thickness values. If the new error value is less than the previous iteration's error value, then it represents a better fit. Additional refinements to the casing wear factor are made and additional iterations of the calculation are completed until the error value reaches a selected value or is within a prescribed range or tolerance level. The resultant casing wear factor is now a back-calculated casing wear factor.

The estimated casing wear factor can be determined by selecting a minimum and a maximum estimated casing wear factor and then the range created by the minimum and maximum values is divided into two parts. Next, representative casing wear factors are identified, for example, at the mid-point of these ranges. These two identified casing wear factors are then used for performing a casing wear simulation to estimate the values of the casing remaining wall thickness. Next, the error value is determined by comparing the simulated/calculated remaining wall thickness values and the actual remaining wall thickness value for both of the representative casing wear factors. The representative casing wear factor with a resultant of a lower error value is likely to provide more accurate simulations in future well operations. The best match casing wear factor likely lies in the range where the casing wear factor provides the minimum error value, called the best match CWF range. This best match CWF range is again divided into two parts and new representative casing wear factors are selected from within each part, for example, at the center of the identified range, or a minimum or maximum value within that range. A new calculation is performed with the newly selected representative casing wear factors and a new error value is determined for each calculation.

For example, an initial estimated casing wear factor range of 0 to 500 can be selected as appropriate for the well site conditions and properties. This range can be divided into two smaller sub-ranges as best determined by the wellsite properties, for example 0-250 and 251-500. A representative casing wear factor can be determined from within each sub-range, for example, selecting the midpoints 125 and 376. The sub-range that has a resultant with a lower error value, after calculating and comparing the estimated casing remaining wall thickness for each representative casing wear factor to the actual remaining wall thickness, is selected. That selected sub-range would be considered the new best match CWF range. For example, if the 125 casing wear factor resulted in a lower error value, then the sub-range 0-250 would be the new best match CWF range and it can further be divided into parts, for example, 0-125 and 126-250. Again, the iterative process of selecting midpoint values, employing them to determine estimated remaining wall thickness values, and comparing the estimated remaining wall thickness values to the actual remaining wall thickness value is repeated until an acceptable casing wear factor is determined.

The number of iterations performed by the processor can be limited to a set number of times before exiting the iteration processing. The set number of times can be limited by a chosen value, for example, 20, or it can depend on the error value itself, for example, an error value of less than 0.01.

After a certain number of iterations, a suitable value for the casing wear factor can be identified that, after processing through the simulation, provides an acceptable match with the actual values of the casing remaining wall thickness. This casing wear factor can be further used with confidence for the next steps in casing wear analysis, by the wellbore operations teams, and in planning for this or other wells with similar properties.

The back-calculated casing wear factor can be employed to perform a casing wear analysis for managing operations occurring within the wellbore. The various operations of the well system plan may include drilling, back-reaming, rotating off-bottom, sliding, reciprocation, or other types of drilling operations. By employing the back-calculated casing wear factor to simulate or estimate executing these selected operations, a time versus wear plot or graph can be created showing the approximate casing wear as each selected operation is in progress over an elapsed time. A best fit trend curve or a best fit trend line can be estimated, using any available technique, such as utilizing a linear regression or other statistical method, to provide a projection of casing wear should the selected operation continue execution over a shorter or longer elapsed time.

The generated graph can also include one or more warning or limit lines showing the point at which an operation best fit trend curve or line would cross such warning or limit lines. The warning or limit lines can be inserted to show different warning levels, for example, a limit line can be placed to show that the current executing operation should be changed or stopped. Additionally, a limit line can be placed at a point on the graph to indicate an action should be performed, such as, ceasing or changing wellbore activities, and taking a casing remaining wall thickness measurement.

A well system operation may also include rotating a drill tool and a drill string within the wellbore. This rotation, in addition to any other wear caused by the well system operation, can cause casing wear and is tracked as the total number of revolutions the drill tool and drill string undergo. The revolution count can be plotted on a graph against the elapsed time during which the revolutions occur and then the elapsed time is plotted against the estimated casing wear that can occur. A best fit trend line can be estimated, using any available technique. The rotations per minute (RPM) of the drill tool and drill string would increase as they are rotated faster. An increased RPM would increase the slope of the best fit trend line, i.e. casing wear would occur at a faster rate over the elapsed time. Likewise, a decreased RPM, would decrease the slope of the best fit trend line, i.e. the casing wear would occur at a slower rate over the elapsed time.

Based on the determined casing wear for each selected operation, the well system plan steps or elapsed time for each selected operation can be revised, or the sequence of selected operations can be rearranged to provide a better fit for the goals and objectives of the well system plan, while maintaining the casing remaining wall thickness within an acceptable range or tolerance level.

The disclosed methods can be implemented directly within a well site controller. As new well log data becomes available, new iterations of the methods can be run to provide well engineers, operators, and planners an estimated casing wear factor that can be used as wellsite operations continue. This information can be used, for example, to determine the number of drill tool and drill string revolutions that can safely be made, to determine the amount of elapsed time the wellbore can safely be in operation, to control the amount of fluid pressure applied within the wellbore, to determine how much lubricant needs to be added, or to determine a better estimate when the next actual well casing remaining wall thickness measurement should take place to minimize the amount of well downtime.

The method can be implemented within a computer program which processes with, or separately from, the well site equipment. For example, the computer program can operate in a controlled or lab environment to better determine the initial estimated casing wear factors for various well site conditions and then utilize those factors in a well system plan.

Turning now to the Figures, FIG. 1 illustrates a diagram of an example of a well site 100. The well site 100 can be used to retrieve hydrocarbons or other valuable materials from below the Earth's surface. The well site 100 includes a wellbore 101, a drill tool 106, a drill string 107, surface equipment 108, and a well site controller 110. The drill string 107 connects the drill tool 106 to the surface equipment 108. The wellbore 101 includes two representative sections 102 and 103. Section 102 has had a casing installed to provide support and leak protection to the wellbore. As the drill tool 106 and drill string 107 are rotated to extend the wellbore 101, friction will cause wear to the casing of section 102. The drill tool 106, drill string 107, and the surface equipment 108 can be conventional devices.

The well site controller 110 directs operation of the well site 100. The well site controller 110 includes a processor and a memory that are configured to control various operations at the well site 100. An operator or engineer may employ the well site controller 110 to assist with or to direct the various operations at the well site 100. The well site controller 110 or portions thereof may be remotely located from the physical location of the wellbore 101. The well site controller 110 is communicatively coupled to at least some of the other components of the well site 100 via hardwire or wireless connections.

Figure 2:
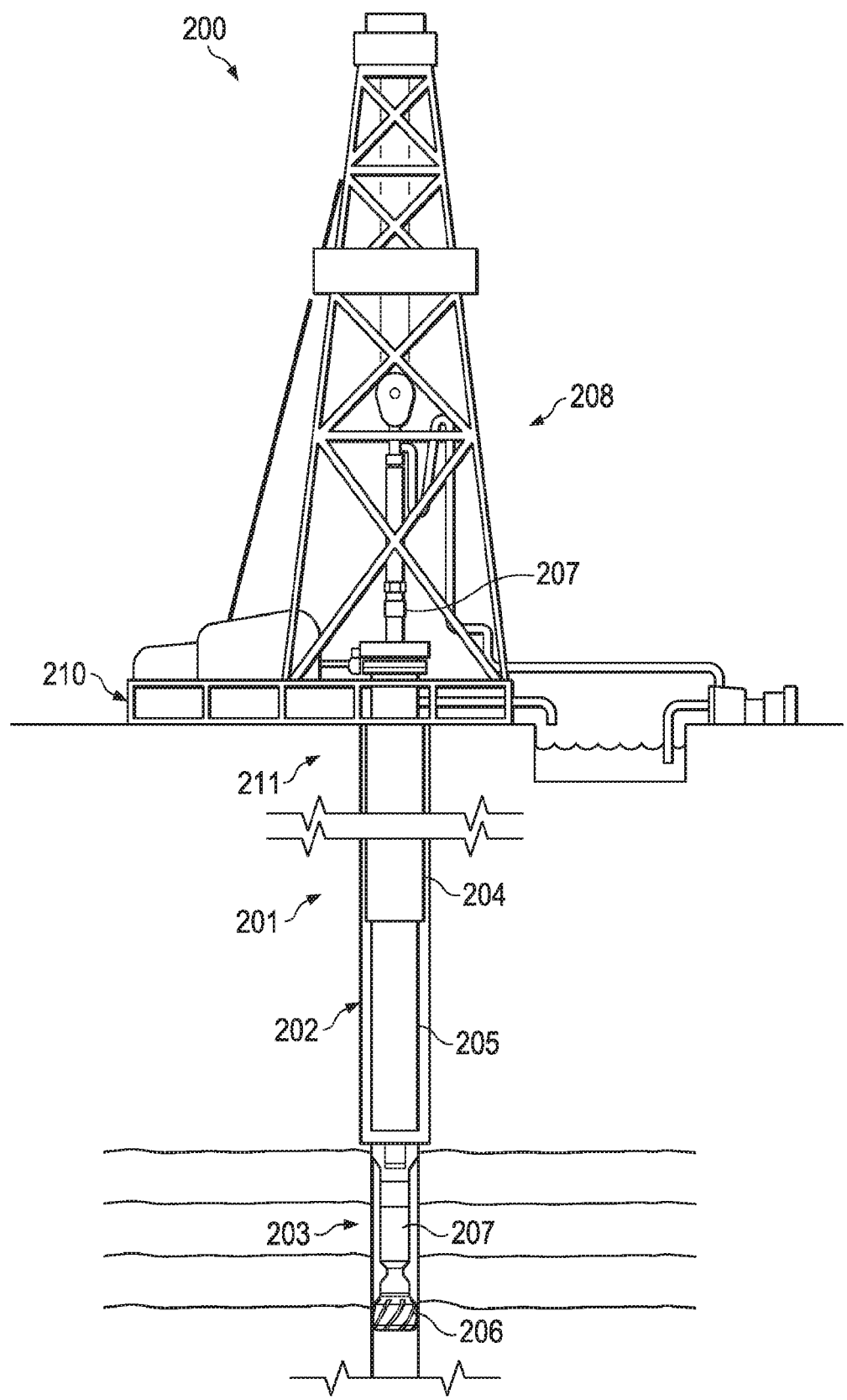
FIG. 2 illustrates a diagram of an example well system with multiple casing sections.

FIG. 2 illustrates a system diagram of another example of a well site, well site 200, that is similar to well site 100. Well site 200 includes a wellbore 211, a drill tool 206, a drill string 207, well site surface equipment 208, and a well site controller 210. The wellbore 211 includes sections 201, 202, and 203. As with the corresponding components of FIG. 1, the drill tool 206, the drill string 207, and the well site surface equipment 208 can be conventional devices or components. The well site controller 210 can be configured as, and function like, the well site controller 110 of FIG. 1. The well site controller 210 can be configured to execute at least a portion of the method disclosed herein. The well site controller 210 can generate a back-calculated casing wear factor. The determined back-calculated casing wear factor can then be used in other well operation steps, for example, determining a drill rotational speed, an elapsed time for executing an operational step, a limit on the number of drill string revolutions, a well system fluid pressure, a casing material to be used, a casing thickness to be used, a recommended time interval for when to conduct an actual casing remaining wall thickness measurement, or to determine other well system factors.

As the wellbore 211 is drilled, it is periodically lined with casing material which is cemented into place, as shown in section 201 with casing material 204. At periodic depths, for example at 2,000 feet, (typical depth locations are between 2,000 to 5,000 feet, but can be more or less depending on specific wellbore characteristics), a narrower wellbore 202 is begun and lined with casing material 205 and cemented into place. While section 202 is being drilled, casing wear will occur in section 201, on casing material 204. The drill tool 206 and drill string 207 are rotated and thereby cause friction against the casing material 204 and a loss of material from 204.

Additional sections can be created prior to the drill tool 206 drilling in the non-cased section 203. For example, there can be three, four, or five, or more sections that are separately cased inside a wellbore as the depth increases or the wellsite properties dictate. This figure is showing, as an example only, two cased sections, 201 and 202, and one non-cased section 203. The drill tool 206 and the drill string 207, as they are rotated, will cause friction against the casing material 204 in section 201 and the well casing 205 in section 202 thereby causing a loss of material at the contact point, called casing wear.

Figure 3:
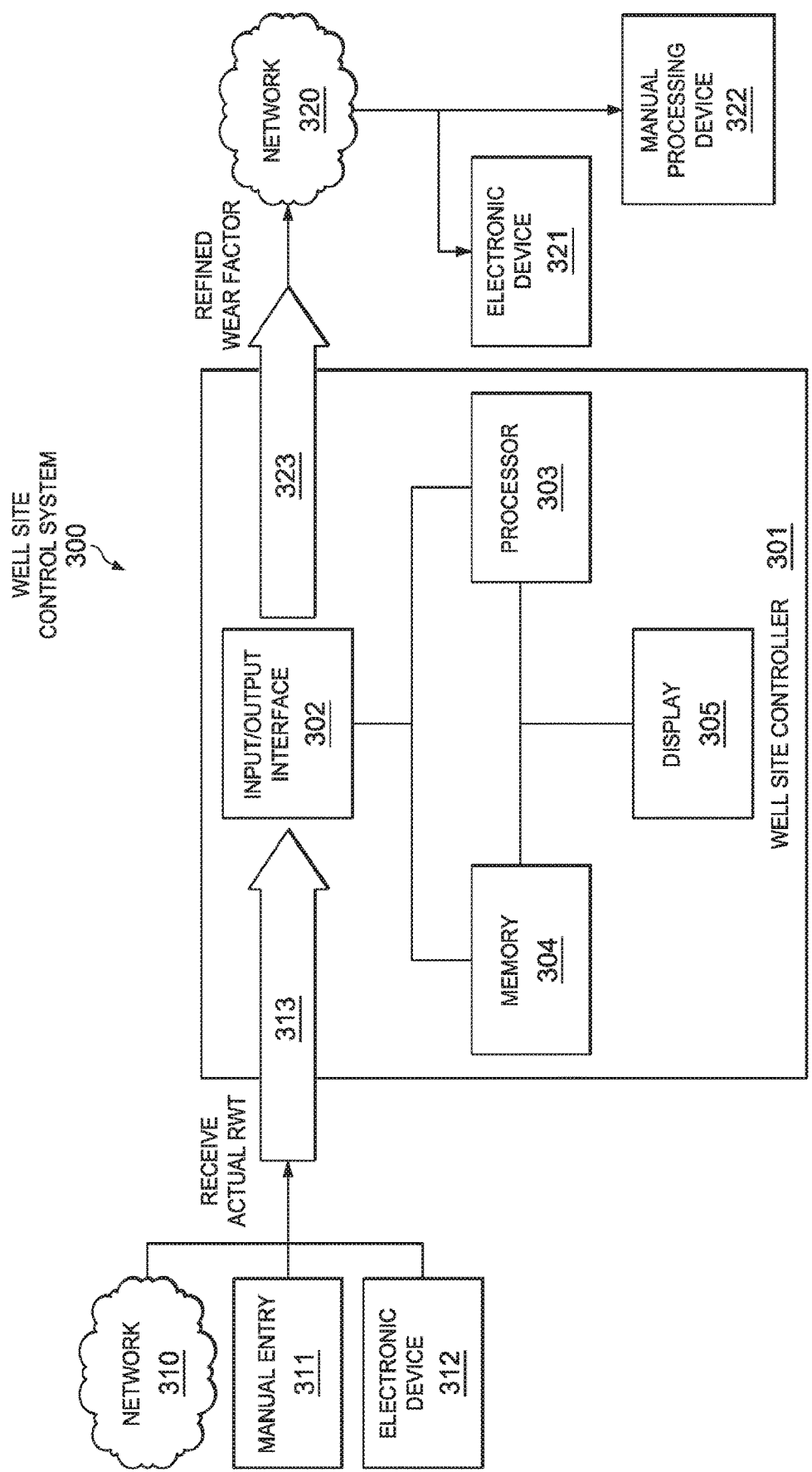
FIG. 3 illustrates a block diagram of an example of a well site control system.

FIG. 3 illustrates a diagram of an example of a well site control system 300. The well site control system 300 includes, in part, a well site controller 301 capable of executing the method described herein. The well site controller 301 is configured to receive input data 313, execute at least some of the methods and simulations disclosed herein, and provide at least some of the resulting data from the executions, resultant data 323, for transmission. Communication interface 302 is configured to receive the input data 313 and transmit the resultant data 323. Input data 313 includes information from at least one of (1) a network connection 310 that can be wired or wireless, (2) an electronic device 312, for example, but not limited to, a mobile phone, PDA, tablet, laptop, well system electronics including sensors, or other device, or (3) by manual entry 311, for example, by a well engineer, operator, or planner. The input data 313 includes, in part, the information gained from actual measurements of the casing remaining wall thickness, i.e. well logs, for example, from calipers, microelectronics, magnetic resonance, or other methods used in the industry. In addition, the input data 313 can also include the specific factors or properties of the wellbore, for example, but not limited to, (1) the elapsed time the drill tool has been rotating, (2) how many rotations per minute the drill tool has been rotating, (3) the type of material being drilled, (4) the angle of the wellbore at the location the measurement was taken, (5) the fluid pressure inside the wellbore, (6) applied friction reducer materials, i.e. lubricants, for example, graphene, and (7) any other pertinent factor.

Input data 313 can also include the initial estimated casing wear factor. If input data 313 does not include the estimated casing wear factor, then this data element can be retrieved by reading the estimated casing wear factors for various wellbore factor or property sets (hereafter wellbore property sets) as stored in memory 304. The wellbore property sets include wellbore properties that correspond to casing wear, such as, the depth, wellbore material, angle of wellbore at point of measurement, fluid pressure in wellbore, lubricant, and casing material. Memory 304 can be any type of electronic storage medium, for example, RAM, data file, data CD, hard disk drive, network storage, database, or any other type of machine readable medium. In FIG. 3, the memory 304 is shown as an element of the well site controller 301. In other embodiments, the memory 304 can be partly located within the well site controller 301 and partly located in another electronic system, or the memory 304 can be fully located in a separate electronic device, for example, a server or database located remotely from the well site controller.

Processor 303 is configured to receive the input data 313 from the communication interface 302. The processor 303 is programmed or configured to obtain an estimated casing wear factor as disclosed herein. The processor 303 can perform multiple iterations of an algorithm to refine the estimated casing wear factor until the error value reaches an appropriate value range or tolerance level, or a set number of times to run the algorithm is reached. Processor 303 can also generate analysis information, for example a graph, showing how a well system plan with its individual operations, affect casing wear over an elapsed period of time.

Display 305 is configured to provide a user interface with the well site controller 301. The display 305 can provide the resulting casing wear factor and well system plan analysis determined by the processor 303 for viewing. Communications interface 302 receives the resultant data 323 from the processor 303 and transmits the resultant data 323 via a wired or wireless network 320 to, for example, but not limited to, (1) an electronic device 321, such as a laptop, mobile phone, PDA, tablet, well site equipment, or other device, or (2) to a manual processing device 322, for example, a display or a printer, to be utilized, for example, by a well engineer, operator, or planner. The electronic device 321 or the manual processing device 322 can be located at or proximate a well site or can be located remotely from the well site.

Well site controller 301 can be further considered as any type of electronic device. For example, the communication interface 302, processor 303, memory 304, and display 305, along with the accompanying software based methods and algorithms of the well site controller 301 can be incorporated into a dedicated electronic circuit, for example, a ROM, RAM, DRAM, or any other type of electronic circuit, that is then incorporated into another device. For this type of implementation, certain components, for example, the display 305 may be optional to the well site controller 301. Alternately, the well site controller 301 can be considered as an independent device, for example, a laptop, PDA, mobile phone, tablet, desktop computer, or other computing device. Additionally, the well site controller 301 can be part of, or a component of, a larger piece of a well system equipment. As described above, FIG. 3 is meant to illustrate how the method can be implemented within a well site control system 300 and is not meant to limit the type, format, or components of the well site controller 301.

Figure 4:
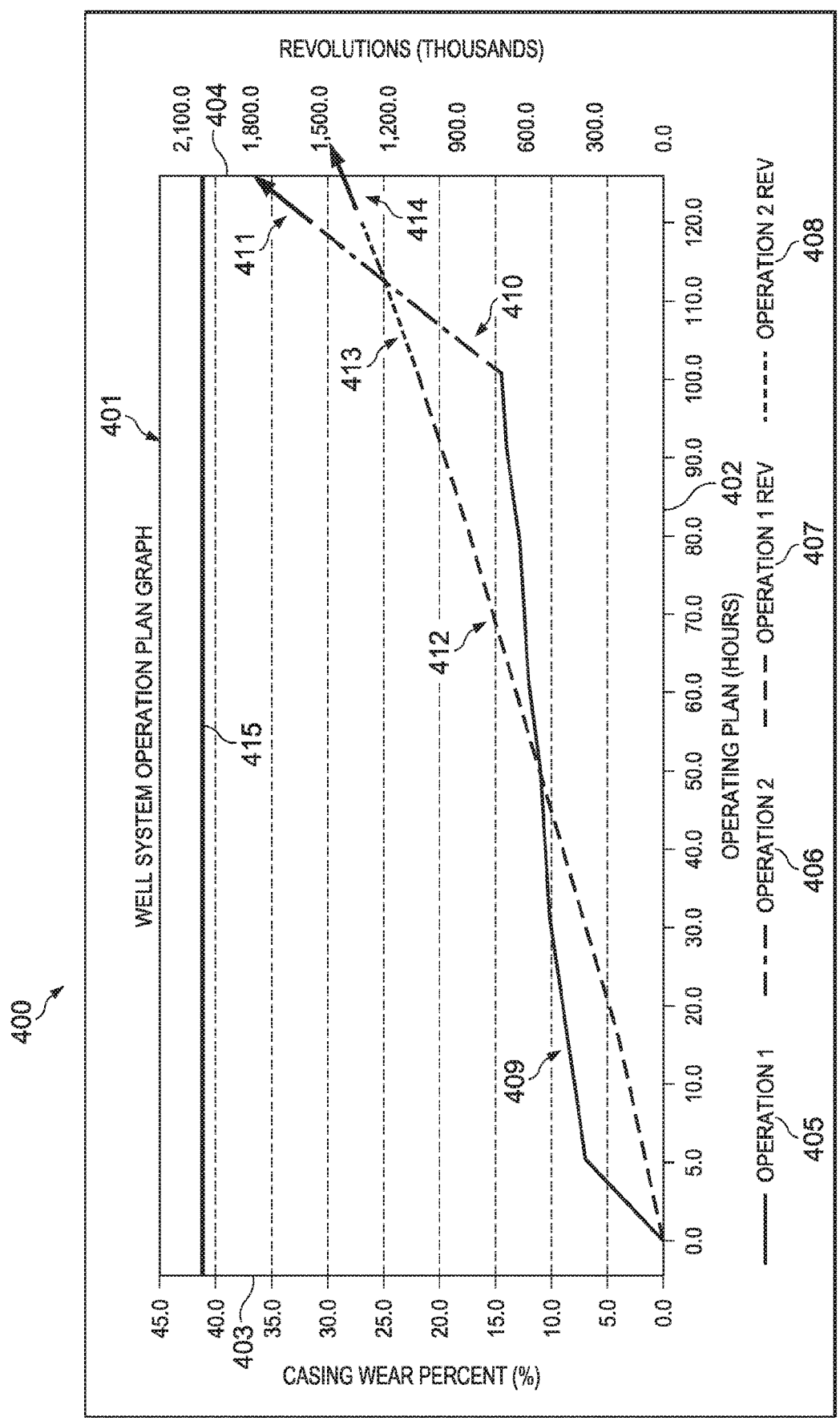
FIG. 4 illustrates a time versus wear plot of an example wellbore operation plan demonstrating casing wear as a percentage over an elapsed time.

FIG. 4 illustrates a graph 400 of an example wellbore operation plan demonstrating casing wear as a percentage over an elapsed time. Graph 400 provides a time versus wear plot as a visual representation of a tool for managing casing wear employing the casing wear factor such as disclosed herein and the casing wear percentage based on well operations and corresponding drill revolutions. As drilling operations progress, the driller and engineer need to be mindful of how quickly they are approaching limit conditions. Hence, values of remaining time and remaining revolutions are estimated based on time ranges that the driller or engineer deems appropriate. The time ranges represent the assumption that in case the operation parameters going forward do not significantly change, the wear progression expected on the casing wall going forward can be accurately predicted by how the wear had progressed in that specified time range.

The graph 400 can be used to estimate remaining time and remaining revolutions for any oil and gas well which can be applied both during the planning phase as well as during any real-time drilling operation. Based on the remaining time and revolutions, the drilling parameters can be adjusted to ensure that the design loads on the casing are not exceeded. This method is fundamentally based on performing a "Time versus Wear" analysis for any well that is drilled. In this analysis, the progression of wear on the casing walls with respect to time is calculated for each of the casing depths. Additionally, the progression of wear with respect to revolutions put on the casing wall is also estimated. Graph 400 provides a plot for the progression of wear with time and revolutions.

The graph 401 includes an x-axis 402 showing elapsed time, a primary y-axis 403 showing casing wear as a percentage, and a secondary y-axis 404 showing a drill tool and drill string revolution count. The graph 400 includes a legend that identifies actual operations of the drill tool according to the well system operation plan. The actual operations include a first operation step 405 and a second operating step 406. The legend also includes respective revolution counts 407 and 408 of the first operation step 405 and the second operation step 406. The graph 401 includes plotted lines 409, 410, 412, 413, that correspond to the identified operations in the legend, best fit trend lines 411 and 414, and a warning or limit line (referred to hereafter as limit line) 415.

The first and second operation steps 405 and 406, can be one of several types of operations, i.e. drilling, back-reaming, rotating off-bottom, sliding, reciprocation, and other types of operations performed by the drill tool. In the example represented by the graph 401, two selected operations, the first operation step 405 and the second operation step 406, are executed in sequence as shown. Other drill tool operations could also be included in the graph 401. A line can also be plotted for the first and second operation steps 405 and 406 showing the change in a casing wear percentage 403 as an elapsed time 402 changes during the execution of the corresponding operation.

Plotted lines 409 and 410 can be generated by an algorithm based in part on the determined casing wear factor as described previously. Plotted lines for one or more additional operations can also be generated as part of an operation plan sequence. A best fit trend curve or trend line 411 can be determined to show how a change in elapsed time of execution of a selected operation would change the casing wear percentage. The elapsed time can be increased or decreased.

The limit line 415 can be determined at any appropriate value based on, for example, design parameters, historical data, and operating experience. Graph 401 is showing a warning at approximately a casing wear percentage of 41.0%. A determination can be made employing graph 401 such that if trend line 411 intersects limit line 415, then the well system engineer, operator, or planner may, if appropriate, alter or modify the well system plan. The goal may be, for example only, to limit the casing wear, limit the number of times an actual casing remaining wall thickness measurement is taken, or any other of a number of different well site goals.

Each selected operation step 405, and additional selected operation step 406, if appropriate, may have an associated revolution count 407 and 408 where said revolution count is a linear count of the number of physical revolutions the drill tool and drill string undergo during the execution of the selected operation. The slope of the plotted lines 412 and 413 directly correlate to the RPMs of the drill tool and drill string. As described above for 409 and 410, plotted lines 412 and 413 can be modified by adjusting the elapsed time of the associated selected operation. A trend line 414 can be determined to show how the casing wear would change with the change in elapsed time for the selected operation. Trend line 414 can also be compared to limit line 415 and an operation plan adjustment made should 414 and 415 intersect.

Figure 5:
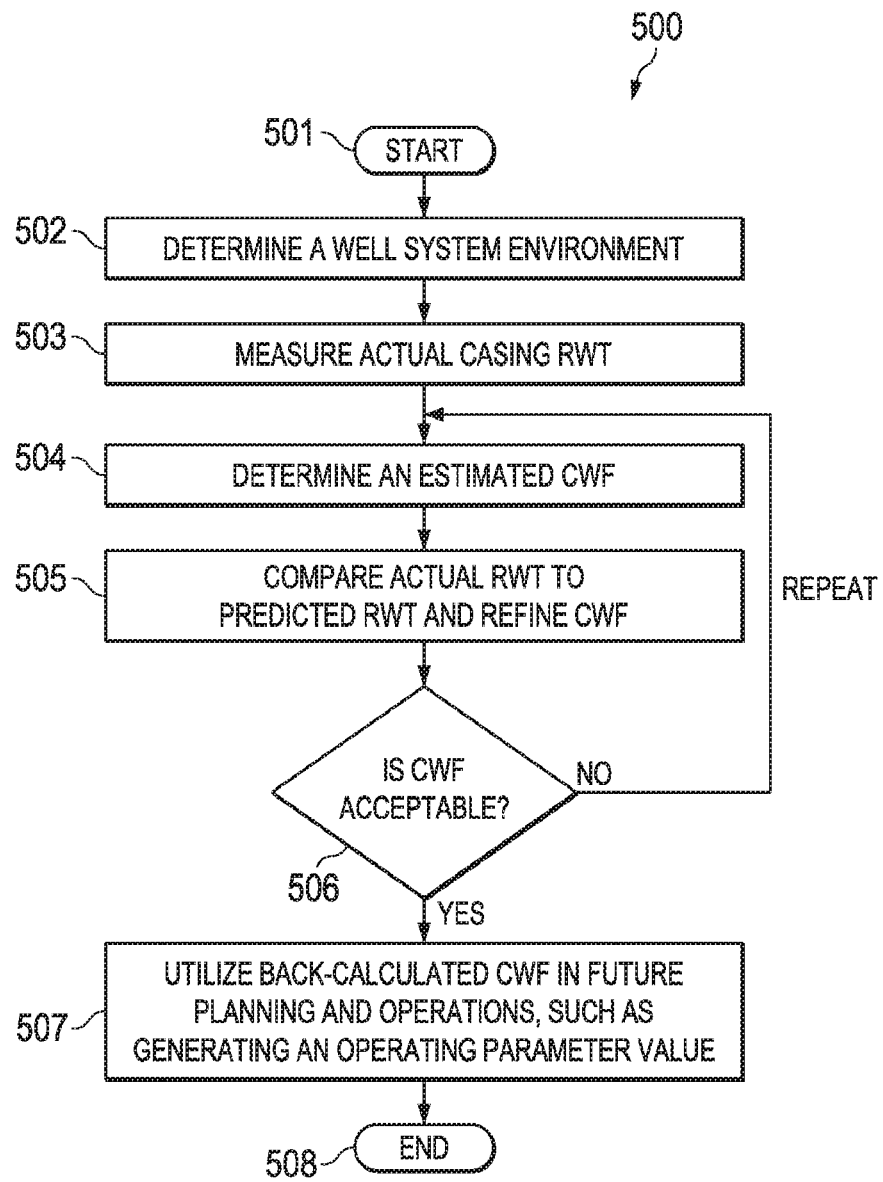
FIG. 5 illustrates a flow diagram of an example method of determining and using a casing wear factor value employing a well log.

FIG. 5 illustrates a flow diagram of an example method 500 of determining and using a casing wear factor value employing a well log. The process starts at step 501 and the well system environment, properties, and factors are determined at step 502. Actual casing remaining wall thickness values are measured at various locations and depths within a wellbore at step 503. The measured remaining wall thickness values are stored in a log. An estimated casing wear factor is determined at step 504. The estimated casing wear factor can be determined through, for example, controlled laboratory experiments, past experiences, and estimated guesses. In a step 505, the actual casing remaining wall thickness is compared to the estimated casing remaining wall thickness based on a continually refined casing wear factor. The method 500 continues to determination step 506 where a decision is made if the refined casing wear factor is acceptable. Acceptance can be based on a set number of iterations specified or whether an error value between the actual casing remaining wall thickness and the estimated remaining wall thickness is within a range or tolerance level deemed acceptable. If the casing wear factor is not acceptable, the method 500 continues to step 504 and repeats. If acceptable, the method 500 continues to step 507 where the refined/back-calculated casing wear factor, by itself or combined with other data, can be used in future well operations and planning at a well site with similar conditions, for example, the current wellbore, or a different wellbore in the same well site, or at a different well site. The method 500 then ends in a step 508.

Figure 6:
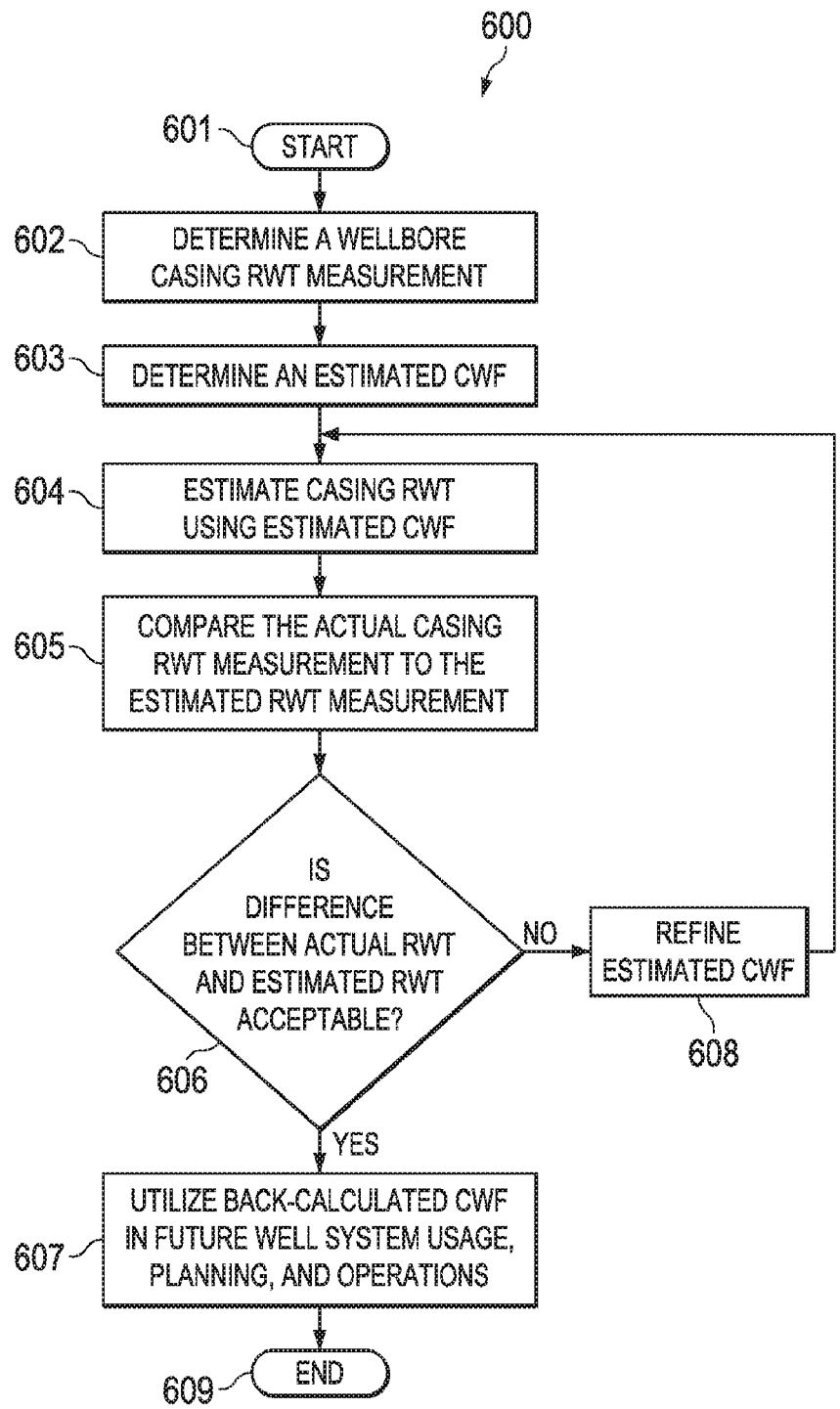
FIG. 6 illustrates a flow diagram of an example of a method of back-calculating a casing wear factor through an iterative process.

FIG. 6 illustrates a flow diagram of an example of a method 600 of back-calculating casing wear factors of a well. The method 600 utilizes an iterative approach and starts at step 601. Actual casing remaining wall thickness measurements for an existing wellbore are taken in a step 602. The actual remaining wall thickness values can be determined via a conventional operation and stored in a wear log for the wellbore. Then an estimated casing wear factor is determined in a step 603. The estimated casing wear factor can be an initial casing wear factor obtained from the well log, similar wellbores, laboratory estimates, etc. The estimated casing wear factor can be based on actual usage conditions. An estimated casing remaining wall thickness is determined using the estimated casing wear factor in a step 604. The estimated remaining wall thickness is for a particular depth of the wellbore. A conventional simulation tool can be employed to calculate the estimated remaining wall thickness using the estimated casing wear factor. In a step 605, the estimated remaining wall thickness is compared with the actual casing remaining wall thickness measurement of the particular depth. In a determination step 606, a decision is made if the difference between the actual and estimated remaining wall thickness values is acceptable. An error value may be used to determine acceptance. For example, if the error value is within an acceptable range or tolerance level, then the difference is deemed acceptable and the method 600 continues to step 607 where the refined casing wear factor, i.e., the back-calculated casing wear factor, by itself or combined with other data, can be used in future well operations and well planning. The method 600 then proceeds to step 609 and ends. Returning to determination step 606, if the difference is not acceptable, then the process continues to step 608 where the casing wear factor is further refined and a new calculation is determined at 604.

Figure 7:
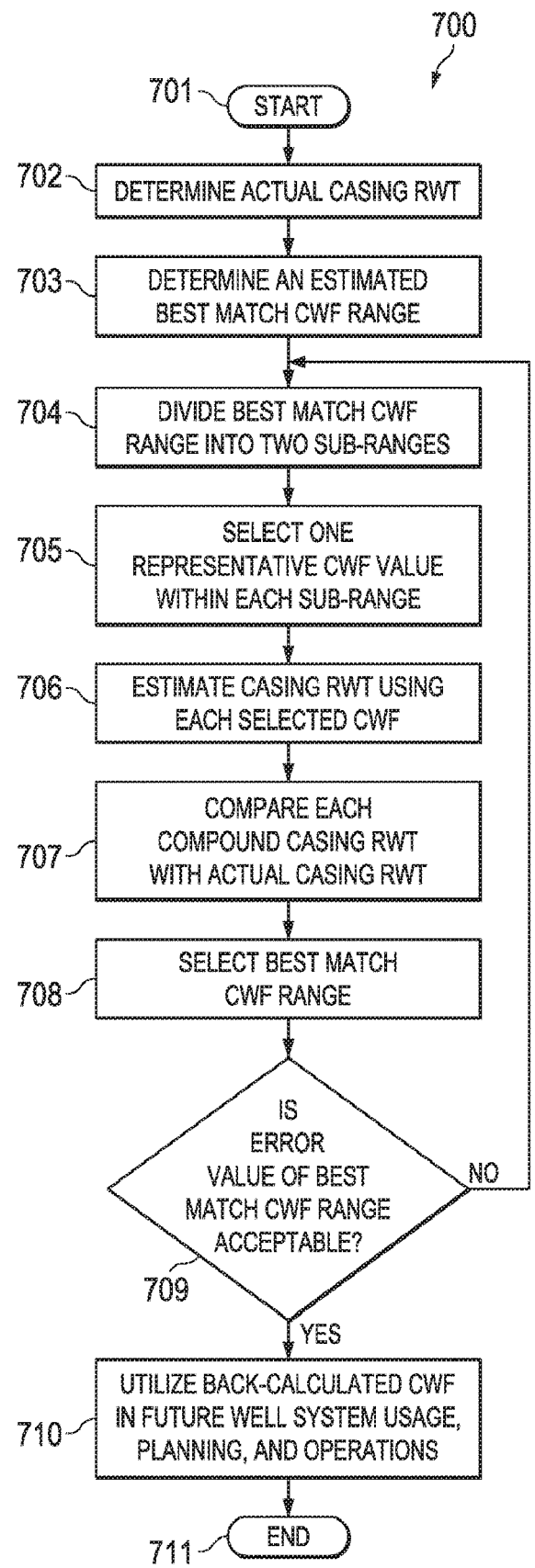
FIG. 7 illustrates a flow diagram of an example of a method of back-calculating a casing wear factor utilizing a best match casing wear factor (CWF) range process.

FIG. 7 illustrates a flow diagram of an example implementation of a method 700 of back-calculating a casing wear factor through an iterative approach using multiple sub-ranges. The method 700 begins in a step 701. In a step 702, the actual casing remaining wall thickness values over several depths are determined. Conventional methods may be used to obtain the remaining wall thickness values of the casing in a wellbore. In a step 703, a best match CWF range of casing wear factors is determined. The best match CWF range can be derived from the specific wellsite conditions, user experience, or other methods. The best match CWF range is divided into two sub-ranges in a step 704 and a representative casing wear factor is selected from each of the sub-ranges in a step 705. In other embodiments, the best match CWF range can be divided into more than two sub-ranges, if needed or appropriate. An estimated remaining wall thickness is calculated in step 706 for a particular casing depth using each one of the representative casing wear factors. A conventional remaining wall thickness simulation program can be used. The resulting estimated remaining wall thickness values are then compared to the actual remaining wall thickness at the particular depth in a step 707. An error value can be developed based on the comparison. A best match CWF range is selected in a step 708 based on the comparison of step 707. The match range having the casing wear factor corresponding to the lowest error value can be selected as the best match CWF range.

A decision is then made in determination step 709 if the casing wear factor of the best match CWF range is acceptable. If not, the method 700 continues to step 704 where the casing wear factor sub-range with the lowest error value is further divided into two smaller sub-ranges. The process continues iteratively until, at determination step 709, the casing wear factor is determined to be acceptable. This can be either the casing wear factor resulting in an error value within the acceptable tolerance range or level, a set number of iterations are completed, or another factor stops the iterative process. At step 710, the determined casing wear factor, by itself or combined with other data, can be used in future usage, planning, and operations of the current wellbore, another wellbore at the wellsite, or another wellsite with similar conditions and properties. The method ends at step 711.

Figure 8:
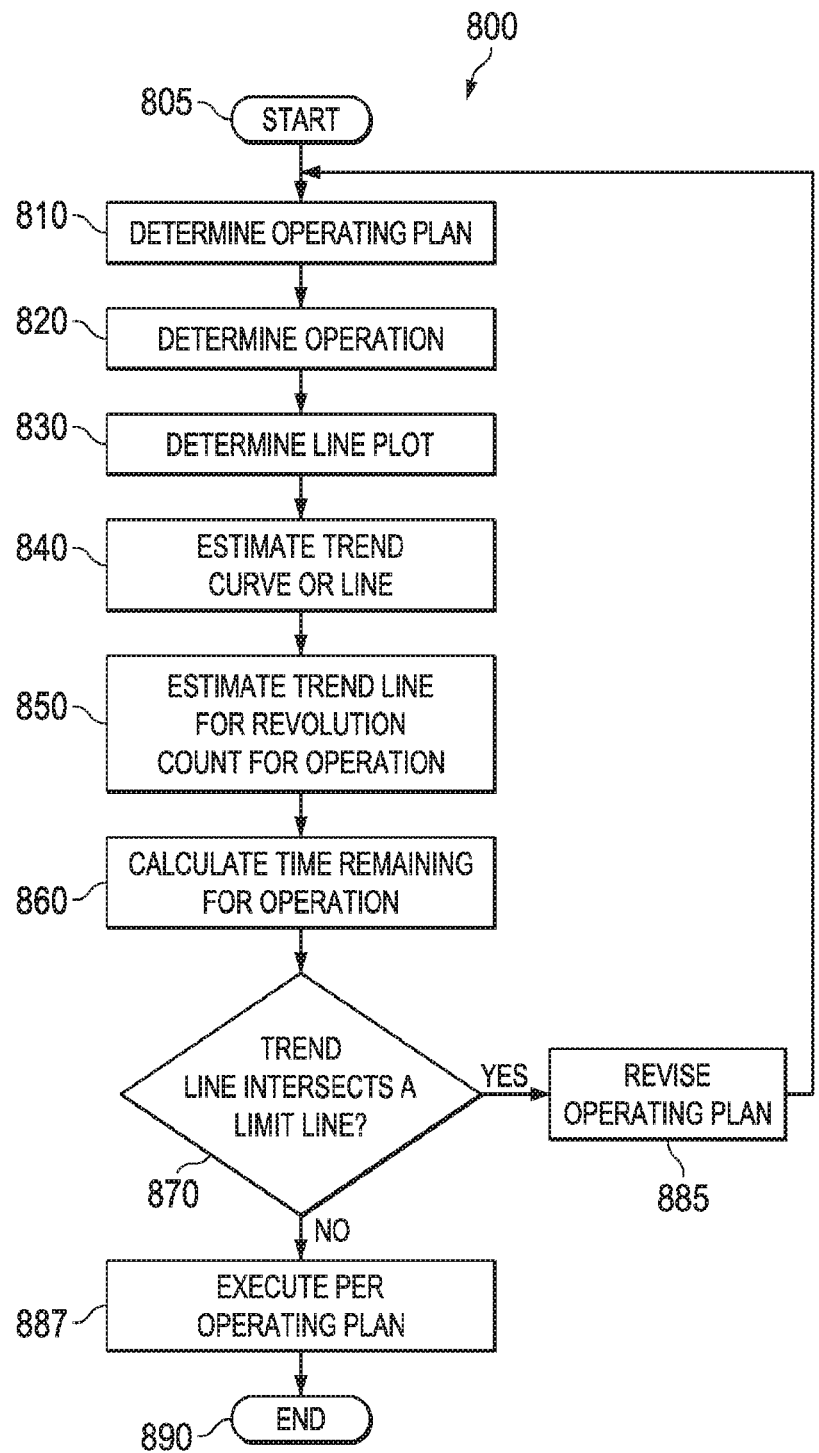
FIG. 8 illustrates a flow diagram of an example of a casing wear analysis method employing a CWF and a drill tool revolution count into a casing wear trend.

FIG. 8 illustrates a flow diagram of an example of a casing wear analysis method 800 utilizing a casing wear factor, to determine an updated well system operation plan. The method 800 corresponds to the steps 507, 607, and 710 of the previous methods described herein, wherein the determined casing wear factors are utilized in well planning and operations. While drilling any oil and gas well, the driller and the engineer aim to get to the target depth without wearing out the casing wall significantly so as to cause any casing failure conditions. Under these situations, it is extremely helpful if the driller has a real-time understanding of how has the wear on the casing walls progressed since the beginning of the drilling operation, and how much time does he have before he causes any major damage to the casing walls. A thorough understanding of the remaining time as well as remaining revolutions will help him more accurately plan and adjust operations real-time so as to remain within the pre-defined constraints and prevent any safety incidents. The method 800 can assist with that understanding and begins in a step 805.

In a step 810, an initial well system operating plan is determined. The plan can include an enumerated, sequenced list of well system operations and an elapsed time to execute each of the operations. The initial development of the plan also includes an estimation of the casing remaining wall thickness, or casing wear, for each operation. The plan can also specify at what elapsed time points an actual casing remaining wall thickness measurement should be taken as well as other operational steps, for example, but not limited to, estimated elapsed time points where casing repair or replace operations may need to take place.

In a step 820, one of the operations is selected for further review. In a step 830, a representation of casing wear for the selected operation is generated employing a casing wear factor, such as the determined casing wear factor from 507, 607, or 710. The representation can be generated via a conventional simulation or algorithm employing a back-calculated casing wear factor such as disclosed herein. This is demonstrated, for example, as line 409 or 410 in graph 400. In a step 840, a best fit trend curve or line, for example 411 or 414, is plotted on the graph. This best fit trend will provide information regarding the change in casing wear should a decision be made to change the elapsed time the selected operation at step 820 would continue to run. The elapsed time can be increased or decreased in length. In a step 850, based on the operation selected at 802, a revolution count for the drill tool and drill string is determined and a similar trend line is estimated for the revolution count to match the change in elapsed time of the correlated operation selected at step 820.

In a step 860, the determined trend lines from steps 840 and 850 are analyzed to provide an updated estimation of the casing wear occurring during the execution of the selected operation. In a determination step 870, the updated casing wear value, demonstrated in graph 400 as a percentage of casing material remaining, is compared to one or more limit lines previously determined, demonstrated as limit line 415. The limit line can indicate that an actual casing remaining wall thickness measurement should be conducted, a critical threshold has been reached on the casing remaining wall thickness, or another factor should be considered. Should a limit line be intersected, then in a step 885, the well system plan is revised to eliminate the intersection. After the plan has been revised in step 885, the method 800 returns to step 810 to re-evaluate the revised plan.

Should the comparing in determination step 870 result in the trend curve or line not intersecting a specified limit line, then the well system plan can be executed in a step 887. The method 800 then ends in a step 890. The method 800 can be repeated after the next actual casing remaining wall thickness measurement is conducted to provide updated information to the well system engineers, operators, and planners.

The disclosure provides an automated method to estimate casing wear factor based on wear logs that provides the best fit rather than a visual judgment used previously for such analysis. A metric can be assigned for any value of wear factor considered to be the best match. Additionally, a more granular-level casing wear analysis is disclosed that is performed section-by-section of the casing that can be used to estimating remaining time and remaining revolutions till wear limit on any casing section is reached. Thus, in contrast to conventional casing wear analysis, the disclosure advantageously provides remaining time and remaining revolution calculations as part of advanced casing wear analysis. Estimates of remaining time and remaining revolutions can be used to better plan the drilling operations by mitigating wear and will help improve casing designs. Such estimates during real-time operations also enable dynamic adjustment of drilling parameters (adjustments while drilling) so that the actual wear on casing walls is kept within the designed wear limits.

In interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

The above-described apparatuses, systems, or methods or at least a portion thereof may be embodied in or performed by various processors, such as digital data processors or computers, wherein the processors are programmed or store executable programs or sequences of software instructions to perform one or more of the steps of the methods or functions of the apparatuses or systems. The software instructions of such programs may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods or functions of the system described herein.

Certain embodiments disclosed herein may further relate to computer storage products with a non-transitory computer-readable medium that have program code thereon for performing various computer-implemented operations that embody at least part of the apparatuses, the systems or carry out or direct at least some of the steps of the methods set forth herein. Non-transitory medium used herein refers to all computer-readable media except for transitory, propagating signals. Examples of non-transitory computer-readable medium include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

Those skilled in the art to which this application relates will appreciate that other and further additions, deletions, substitutions and modifications may be made to the described embodiments. It is also to be understood that the terminology used herein is for the purpose of describing particular embodiments only, and is not intended to be limiting, since the scope of the present disclosure will be limited only by the claims.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, a limited number of the exemplary methods and materials are described herein.

It is noted that as used herein and in the appended claims, the singular forms "a", "an", and "the" include plural referents unless the context clearly dictates otherwise.

Embodiments disclosed herein include:

A. A method for determining casing wear of casing in a wellbore, comprising obtaining actual remaining wall thickness (RWT) values of a wellbore casing that correspond to a set of casing depth values of a wellbore, calculating estimated RWT values for the set of casing depth values based on at least one estimated casing wear factor (CWF) value; and determining a back-calculated CWF value for the wellbore based on a comparison between the actual RWT values and the estimated RWT values, wherein the calculating and the determining are performed by a processor.

B. A well site controller, comprising an interface configured to receive actual remaining wall thickness (RWT) values that correspond to a set of casing depth values of a wellbore and a processor configured to determine a back-calculated casing wear factor (CWF) value for the wellbore based on a comparison between the actual RWT value and an estimated RWT value, for the set of casing depth values, where the estimated RWT value is calculated using an estimated CWF value as input.

C. A computer program product including a series of operating instructions stored on a non-transitory computer readable medium that directs a processor to perform a casing wear analysis method, wherein the method comprises determining a back-calculated casing wear factor (CWF) value for casing in a wellbore based on a comparison between actual remaining wall thickness (RWT) values of the casing and estimated RWT values of the casing and determining, employing the back-calculated CWF value, an amount of time to perform a first well system operation in the wellbore before occurrence of a casing condition.

Each of embodiments A, B, and C may have one or more of the following additional elements in combination:

Element 1: wherein the calculating includes calculating multiple estimated RWT values for the set of casing depth values employing a different estimated CWF value for each of the multiple estimated RWT values. Element 2: wherein the determining includes comparing the actual RWT values to the estimated RWT values, ascertaining a best match CWF range from one of the estimated CWF values based on the comparing, and selecting the estimated CWF value from the best match CWF range as the back-calculated CWF value. Element 3: wherein the calculating and the determining are performed iteratively. Element 4: wherein the multiple estimated RWT values are two and the different estimated CWF values are determined based on a minimum and a maximum value for CWF. Element 5: wherein the calculating and the determining are performed a set number of times. Element 6: wherein the best match CWF range is one of the multiple CWF ranges having greatest correlation with the actual RWT values. Element 7: further comprising performing a casing wear analysis of the casing employing the back-calculated CWF. Element 8: wherein the casing wear analysis includes estimating an amount of time performing a well system operation before occurrence of a casing condition. Element 9: wherein the casing wear analysis includes estimating a remaining number of revolutions of a drill string when performing a well system operation before occurrence of a casing condition. Element 10: further comprising a memory module configured to store a field wear log of the wellbore that includes the actual RWT values. Element 11: further comprising a memory module configured to store a set of estimated CWF values correlated by a wellbore property set, where the processor selects an initial CWF value therefrom. Element 12: wherein the back-calculated CWF value is used to determine at least one of a elapsed time to execute a selected operation, number of revolutions for a selected operation, a drill rotational speed, a wellbore fluid pressure, a recommended time interval before an actual RWT measurement, a casing material, and a casing thickness. Element 13: wherein the determining the back-calculated CWF includes calculating multiple RWT values for the set of casing depth values employing a different estimated CWF value for each of the multiple RWT values. Element 14: wherein the determining the back-calculated CWF includes comparing the actual RWT values to the multiple RWT values, ascertaining a best match CWF range from one of the multiple RWT values based on the comparing, and selecting a new CWF value from the best match CWF range as the back-calculated CWF value. Element 15: wherein the determining the back-calculated CWF is performed iteratively. Element 16: wherein the determining the back-calculated CWF is performed a set number of times. Element 17: wherein the best match CWF range is one of the multiple CWF ranges having greatest correlation with the actual RWT values. Element 18: wherein the selected operation is one of drilling, back-reaming, rotating off-bottom, sliding, and reciprocation. Element 19: further comprising estimating a remaining number of revolutions of a drill when performing a second well system operation before occurrence of second casing condition. Element 20: wherein the first and second well system operation are the same well system operation and the first and second casing condition is the same casing condition. Element 21: wherein the well system operation is one of drilling, back-reaming, rotating off-bottom, sliding, and reciprocation. Element 22: wherein the determining of the back-calculated CWF value includes obtaining actual RWT values for the wellbore casing that correspond to a set of casing depth values of the wellbore, calculating estimated RWT values for the set of casing depth values based on at least one estimated CWF value, and determining the back-calculated CWF value for the wellbore based on a comparison between the actual RWT values and the estimated RWT values.

What is claimed is:

1. A method to determine casing wear of casing in a wellbore, comprising:
    obtaining actual remaining wall thickness (RWT) values of a wellbore casing that correspond to a set of casing depth values of said wellbore;
    calculating multiple estimated RWT values for said set of casing depth values employing a different estimated casing wear factor (CWF) value for each of said multiple estimated RWT values;
    determining a back-calculated CWF value for said wellbore by comparing said actual RWT values and said estimated RWT values, ascertaining a best match CWF range from one of said estimated CWF values based on said comparing, and selecting said estimated CWF value from said best match CWF range as said back-calculated CWF value; and
    employing said back-calculated CWF value to modifying at least one parameter for performing a well system operation, wherein said well system operation is one of drilling, back-reaming, rotating off-bottom, sliding, and reciprocation.

2. The method as recited in claim 1 wherein said multiple estimated RWT values are two.

3. The method as recited in claim 2 wherein said different estimated CWF values are determined based on a minimum and a maximum value for CWF.

4. The method as recited in claim 1 wherein said best match CWF range is one of multiple CWF ranges having greatest correlation with said actual RWT values.

5. The method as recited in claim 1, wherein said calculating and said determining are iteratively performed.

6. The method as recited in claim 1, wherein said calculating and said determining are performed a set number of times.

7. The method as recited in claim 1, further comprising performing a casing wear analysis of said casing employing said back-calculated CWF value.

8. The method as recited in claim 7 wherein said casing wear analysis includes estimating an amount of time performing a well system operation before occurrence of a casing condition.

9. The method as recited in claim 7 wherein said casing wear analysis includes estimating a remaining number of revolutions of a drill string when performing a well system operation before occurrence of a casing condition.

10. A well site controller, comprising:
    an interface configured to receive actual remaining wall thickness (RWT) values that correspond to a set of casing depth values of a wellbore; and
    a processor configured to determine, for said set of casing depth values, a back-calculated casing wear factor (CWF) value for said wellbore by calculating multiple RWT values for said set of casing depth values employing a different estimated CWF value for each of said multiple RWT values, comparing said actual RWT values to said multiple RWT values, ascertaining a best match CWF range from one of said multiple RWT values based on said comparing, and selecting a new CWF value from said best match CWF range as said back-calculated CWF value, and direct a well system operation according to a modified parameter determined based on said back-calculated CWF value.

11. The well site controller as recited in claim 10 further comprising a memory module configured to store a field wear log of said wellbore that includes said actual RWT values.

12. The well site controller as recited in claim 10 further comprising a memory module configured to store a set of estimated CWF values correlated by a wellbore property set, where said processor selects an initial CWF value therefrom.

13. The well site controller as recited in claim 10 wherein said processor is further configured to employ said back-calculated CWF value to determine said modified parameter.

14. The well site controller as recited in claim 13 wherein said selected operation is one of drilling, back-reaming, rotating off-bottom, sliding, and reciprocation.

15. The well site controller as recited in claim 13, wherein said modified parameter is an elapsed time to execute a selected operation or a number of revolutions of a drill for a selected operation.

16. The well site controller as recited in claim 13 wherein said modified parameter is a drill rotational speed.

17. The well site controller as recited in claim 13, wherein said modified parameter is one of a wellbore fluid pressure, a recommended time interval before an actual RWT measurement, a casing material, and a casing thickness.

18. The well site controller as recited in claim 10 wherein said best match CWF range is one of multiple CWF ranges having greatest correlation with said actual RWT values.

19. The well site controller as recited in claim 10, wherein said processor is configured to iteratively determine said back-calculated CWF value.

20. The well site controller as recited in claim 19 wherein said processor is configured to determine said back-calculated CWF value a set number of times.

21. A computer program product including a series of operating instructions stored on a non-transitory computer readable medium that directs a processor to perform a casing wear analysis method, wherein said method comprises:
   determining a back-calculated casing wear factor (CWF) value for casing in a wellbore based on a comparison between actual remaining wall thickness (RWT) values of said casing and estimated RWT values of said casing;
   determining, employing said back-calculated CWF value, an amount of time to perform a first well system operation in said wellbore before occurrence of a first casing condition;
   directing said first well system operation using said amount of time; and
   estimating a remaining number of revolutions of a drill when performing a second well system operation before occurrence of a second casing condition.

22. The computer program product of claim 21, wherein said first well operation is a different well operation than said second well operation.

23. The computer program product of claim 21 wherein said first and second well system operations are the same well system operation and said first and second casing condition is the same casing condition.

24. The computer program product of claim 21, wherein said first well system operation is one of drilling, back-reaming, rotating off-bottom, sliding, and reciprocation.

25. The computer program product of claim 21, wherein determining said back-calculated CWF value includes:
   obtaining actual RWT values for said wellbore casing that correspond to a set of casing depth values of said wellbore;
   calculating estimated RWT values for said set of casing depth values based on at least one estimated CWF value; and
   determining said back-calculated CWF value for said wellbore based on a comparison between said actual RWT values and said estimated RWT values.

* * * * *